United States Patent [19]

Mattausch et al.

[11] Patent Number: 5,170,375
[45] Date of Patent: Dec. 8, 1992

[54] HIERARCHICALLY CONSTRUCTED MEMORY HAVING STATIC MEMORY CELLS

[75] Inventors: Hans-Juergen Mattausch, Brunnthal-Faistenhaar; Bernhard Hoppe, Munich; Gerd Neuendorf, Germering; Doris Schmitt-Landsiedel, Ottobrunn; Hans-Joerg Pfleiderer, Zorneding; Maria Wurm, Ottobrunn, all of Fed. Rep. of Germany

[73] Assignee: Siemens Aktiengesellschaft, Munich, Fed. Rep. of Germany

[21] Appl. No.: 782,798

[22] Filed: Sep. 18, 1991

Related U.S. Application Data

[63] Continuation of Ser. No. 488,612, Feb. 27, 1990, abandoned.

[30] Foreign Application Priority Data

Apr. 21, 1989 [DE] Fed. Rep. of Germany ....... 3913209

[51] Int. Cl.$^5$ ................................................ G11C 7/00
[52] U.S. Cl. ........................... 365/230.03; 365/230.05
[58] Field of Search .............. 365/154, 230.01, 230.03, 365/230.04, 230.05, 189.01

[56] References Cited

U.S. PATENT DOCUMENTS

| | | | |
|---|---|---|---|
| 3,629,612 | 12/1971 | Harbert | 365/156 |
| 4,768,172 | 8/1988 | Sasaki | 365/230.05 |
| 4,984,201 | 1/1991 | Sato et al. | 365/51 |
| 5,093,809 | 3/1992 | Schmitt-Landsiedel | 365/230.03 |

OTHER PUBLICATIONS

Mead C., et al. "Highly Concurrent Structures with Global Communications," Introduction to VLSI Systems, 2nd Edition, Addison Wesley, 1980, Chapter 8.5, pp. 313–323.

Sasaki K. et al. "Static RAMs", 1988 IEEE International Solid-State Circuits Conference, 0193-653/88/0000-0174501.00 pp. 174-189.

Primary Examiner—Joseph L. Dixon
Assistant Examiner—Jack A. Lane
Attorney, Agent, or Firm—Hill, Van Santen, Steadman & Simpson

[57] ABSTRACT

A static memory is constructed in a plurality of hierarchy levels. Beneficial realization possibilities are set forth with respect to the surface utilization for the drive and read-out circuits in the second hierarchy level which are especially critical. Memory cells that supply a strong cell signal are advantageously utilized so that a low expense is needed in the read circuit. By displacing periphery circuits into higher hierarchy levels, a short access time and a reduced surface requirement arise.

19 Claims, 6 Drawing Sheets

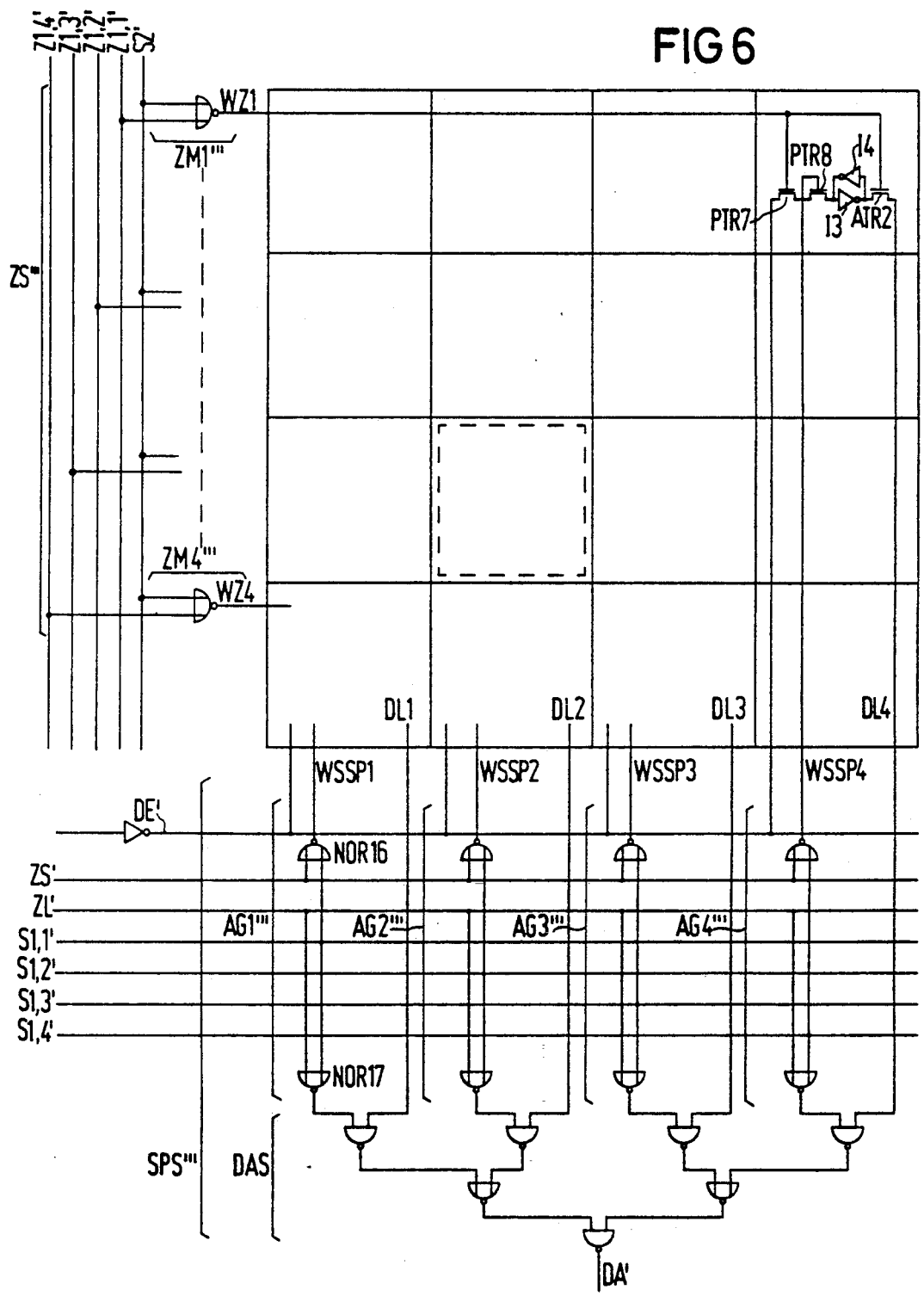

HIERARCHICALLY CONSTRUCTED MEMORY HAVING STATIC MEMORY CELLS

This is a continuation of application Ser. No. 488,612, filed Feb. 27, 1990, now abandoned.

BACKGROUND OF THE INVENTION

1. Field of the Invention

The present invention relates to a memory hierarchically constructed of memory cells which are combined to form memory groups, and in which a column circuit and a row circuit for selecting, reading and writing are assigned to each memory cell in the memory group so that a memory is divided into more than two hierarchy levels.

2. Description of the Prior Art

As reported in the publication ISSCC Digest of Technical Papers, 1988, Session 13: "Static RAMs", fast static memories constructed in complementary metal-oxide-semiconductor (CMOS) technology are usually realized with four or six transistor cells in at most two hierarchy levels. A higher speed is usually achieved with an improvement of the technology in view of the structure fineness, of the multi-layer wiring and specific process options such as "buried contact" or high-impedance polysilicon.

Within a given process, however, speed advantages can also be achieved with circuit-oriented measures. To this end, it has already been proposed to shorten the access time by the introduction of a plurality of hierarchy levels since the delay times on long word and data lines are avoided. However, a dynamic one-transistor memory cell is considered for this purpose in the publication by C. Mead and L. Conway, "Introduction to VLSI-Systems", Second Edition, Addison-Wesley, 1980, Chapter 8.5. FIG. 8.31 of this publication shows a memory divided into two hierarchy levels that, however, does not contain any more detailed particulars regarding the construction of periphery circuits, such as decoders and read amplifiers. The structure of the first hierarchy level for a 16 cell block is shown in FIG. 8.32 of the publication. The speed advantage made possible by the hierarchal structure is acquired at the expense of an increased speed due to the multiplication of the drive and read circuits, particularly on the first hierarchy level.

SUMMARY OF THE INVENTION

The object of the present invention is to provide an hierarchically-constructed memory having short access time that requires small dimensions for formatting.

The above object is achieved, according to the present invention, in a memory which is hierarchically constructed of memory cells, whereby the memory cells are combined to form memory groups and a column circuit and a row circuit for selecting, reading and writing are assigned to each memory cell in the memory group, whereby the memory is divided into more than two hierarchy levels, and is particularly characterized in that the first hierarchy level is formed by one memory cell, the second hierarchy level is formed by memory cells combined into memory groups and each next-higher hierarchy level is constructed of elements of the next-lower hierarchy levels, in that every hierarchy level has a column and row circuit for selecting, reading and writing assigned to the elements of the hierarchy level, and in that the surface-consuming circuit parts of the column and row circuits of the lower hierarchy level are realized in higher hierarchy levels.

The advantages achieved in practicing the present invention are particularly that the formatting in a plurality of hierarchy levels can also be employed for static memories. Here, also, the surface expense for the drive and read-out circuits in the first hierarchy level is particularly critical. Memory cells that supply a strong cell signal are therefore advantageous, so that little expense is needed in the read circuit. A further advantage of the invention is that the periphery circuits in the column and row circuits that require surface-consuming circuit parts, such as decoders and data multiplexers, are constructed in the upper hierarchy levels insofar as possible.

According to a feature of the invention, the memory cells are static memory cells, and each memory cell is equipped with a data line for writing information into the memory cell and a data line for reading information out of the memory cell.

According to another feature of the invention, the decoder circuits for column address lines and row address lines in the column and row circuits of the lower hierarchy level are realized in a higher or highest hierarchy level.

According to another feature of the invention, the second hierarchy level is constructed with a memory group comprising n·m memory cells, where n and n are whole numbers, in rows and columns and the memory group has n row address lines and m column address lines assigned thereto, that a column circuit of the second hierarchy level contains a data evaluation circuit that comprises two inputs and one common output per column, one first input being connected to a data line for reading information out of the memory cells of a column, and that the two inputs per column are operated with one another via NAND-NOR gates and the outputs of the NAND-NOR gates are connected via NAND gates to the common output of the data evaluation circuit.

According to another feature of the invention, the memory is particularly characterized in that a NAND gate having two inputs and one output contains two field effect transistors of a first conductivity type and two field effect transistors of a second conductivity type, in that the field effect transistors of the first conductivity type are connected in series, whereby a first terminal of the first field effect transistor of the first conductivity type is connected to the supply voltage and a first terminal of the second field effect transistor of the first conductivity type forms the output of the NAND gate, that a gate terminal of the first field effect transistor of the first conductivity type and a gate terminal of the first field effect transistor of the second conductivity type together form the first input of the NAND gate and a gate terminal of the second field effect transistor of the first conductivity type and a gate terminal of the second field effect transistor of the second conductivity type together represent the second input of the NAND gate, and in that the first and second field effect transistors of the second conductivity type are connected in parallel between a reference potential and the first terminal of the second field effect transistor of the first conductivity type.

According to another feature of the invention the memory is particularly characterized in that a NAND-NOR gate having four inputs and one output contains a field effect transistor of a first conductivity type and four field effect transistors of a second conductivity type, in that respectively two of the four field effect transistors of the second conductivity type are connected in series and form a first series circuit and a second series circuit, in that the first and second series circuits are interconnected in parallel between a reference potential and a common terminal, in that the field effect transistor of the first conductivity type is arranged between the supply voltage and the common terminal, and the common terminal forms the output of the NAND-NOR gate, in that a gate terminal of the field effect transistor of the first conductivity type is connected to the reference potential and the gate terminals of the field effect transistors of the first series circuit and gate terminals of the field effect transistors of the second series circuit form, in respective pairs, inputs of the NAND-NOR gate that are to be interconnected to the two inputs per column of the data evaluation circuit.

According to another feature of the invention, a memory constructed in accordance with the present invention is particularly characterized in that each memory cell of the memory group contains a transfer gate, two inverters and a selection transistor, in that the transfer gate is connected between that data line for writing information that belongs to the column of the memory cell and an input of the first inverter, in that the second inverter is fed back onto the first inverter and the selection transistor is connected between an output of the first inverter and that data line for reading information that belongs to the column of the memory cell.

According to another feature of the invention, a memory hierarchally constructed of memory cells is particularly characterized in that each memory cell of the memory group contains two series-connected selection transistors for writing information into the memory cell, two inverters and a selection transistor for reading information out of the memory cell, in that the two series-connected selection transistors are connected between that data line for writing information belonging to the column of the memory cell and an input of the first inverter, in that the second inverter is fed back onto the first inverter and the selection transistor is connected between an output of the first inverter and that data line for reading information that belongs to the column of the memory cell.

According to another feature of the invention, a memory hierarchally constructed of memory cells is particularly characterized in that the memory group has a column line for reading, a column line for writing, a row line, a data input line and a data output line assigned thereto, in that the row circuit contains n row modules, whereby respectively one row module is assigned to a row of memory cells, in that a first output and a second output of each row module are interconnected to a first and a second control input of all transfer gates in the appertaining row of memory cells and a third output is connected to a gate terminal of all selection transistors in the appertaining row of memory cells, in that a first input of each row module is to be interconnected to the column line for reading, a second input of each row module is to be interconnected to the column line for writing and a third input of each row module is to be interconnected to the appertaining row address line, in that the column circuit contains m transfer gates and m selection gates, whereby respectively one transfer gate and respectively one selection gate are assigned to a column of memory cells, in that each transfer gate is connected between the data input and that data line for writing information that belongs to the column, and that each transfer gate is assigned to a common control terminal that is connected, first of all, directly to a first control input and, via an inverter, to a second control input of the appertaining transfer gate and that, secondly, is connected to an output of the appertaining selection gate and one of the two inputs of the data evaluation circuit assigned per column, and in that each selection gate is to have a first terminal connected to the row line and is to have a second terminal connected to the appertaining column address line.

According to another feature of the invention, a memory hierarchally constructed of memory cells as set forth above is particularly characterized in that each row module contains two NOR gates and an inverter, in that a first terminal of the first NOR gate forms the first terminal of a row module, a first terminal of the second NOR gate forms the second terminal of a row module and a second terminal of the first and a second terminal of the second NOR gates together form the third input of a row module, in that an output of the first NOR gate represents the first input and, via a further inverter, represents the second output of a respective row module and an output of the second NOR gate forms the third output of a row module, in that each selection gate is constructed with the assistance of a respective NOR gate whereby an output of a NOR gate represents the output of a selection gate and a first and a second input of a NOR gate represents the first input and the second input of a selection gate, and in that the row address lines, the column address lines, the column line for reading, the column line for writing, the row line and the data output line are wired with "active low" signals.

According to another feature of the invention, the memory is particularly characterized in that each row module contains two field effect transistors of a first conductivity type and four field effect transistors of a second conductivity type and an inverter. The first field effect transistor of the first conductivity type is respectively series connected with the first field effect transistor of the second conductivity type and the second field effect transistor of the first conductivity type is respectively series connected to the second field effect transistor of the second conductivity type, whereby a first terminal of the first field effect transistor of the first conductivity type in common with a gate terminal of the third field effect transistor of the second conductivity type forms the first input of a row module, a first terminal of the second field effect transistor of the first conductivity type in common with a gate terminal of the fourth field effect transistor of the second conductivity type forms the second input of a row module and a gate terminal of the first field effect transistor of the first conductivity type, a gate terminal of the first field effect transistor of the second conductivity type, a gate terminal of the second field effect transistor of the first conductivity type and a gate terminal of the second field effect transistor the second conductivity type together form the third input of a row module. A first terminal of the first field effect transistor of the second conductivity type and a first terminal of the second field effect transistor of the second conductivity type are connected in common to a reference potential. A second terminal of the first field effect transistor of the first conductivity type and a second terminal of the first field effect transistor of the second conductivity type together form the third output of a row module. The third field effect transistor of the second conductivity type is connected between the third output and the reference potential. A second terminal of the second field effect transistor of the first conductivity type and a second terminal of the second field effect transistor of the second conductivity type together form the first output of a row module and, via a further inverter, represent the second output of a row module, whereby the first output of a row module is interconnected via the fourth field effect transistor of the second conductivity type to the reference potential. Each selection gate contains a field effect transistor of a first conductivity type and two field effect transistors of a second conductivity type, whereby the first field effect transistor of the first conductivity type and the first field effect transistor of the second conductivity type are connected in series between the row line and the reference potential. A gate terminal of the first field effect transistor of the first conductivity type and a gate terminal of the first field effect transistor of the second conductivity type are connected in common to an appertaining column address line and a second terminal of the first field effect transistor of the first conductivity type and a second terminal of the first field effect transistor of the second conductivity type represent the output of a selection gate, whereby the latter is connected via a second field effect transistor of the second conductivity type to the reference potential and a gate terminal of the second field effect transistor of the second conductivity type of each selection gate is connected to the row address line via an inverter. The row address lines, the column address lines and the data input line are connected with "active low" signals and the row line, the column line for writing and the column line for reading are connected with "active high" signals.

According to another feature of the invention, a memory hierarchically constructed of memory cells as set forth above is particularly characterized in that a transfer gate is constructed of a field effect transistor of a first conductivity type and a field effect transistor of a second conductivity type, in that the field effect transistor of the first conductivity type is connected in parallel with the field effect transistor of the second conductivity type and a gate terminal of the field effect transistor of the second conductivity type forms the second control input and a gate terminal of the first field effect transistor of the first conductivity type forms the first control input of a transfer gate.

According to another feature of the invention, a memory is particularly characterized in that the memory group has a column line for reading, a column line for writing, a row line, a data input line and a data output line assigned thereto. The row circuit contains n row modules whereby respectively one row module is assigned to a row of memory cells. A second output of a row module is connected to a gate terminal of each selection transistor for reading information out of the appertaining row of memory cells, a first output of a row module is connected to a gate terminal of all first of the two series-connected selection transistors for writing information in the appertaining row of the memory cell. A first input of each row module is to be interconnected to the column line for writing, a second input of each row module is to be interconnected to the column line for reading and a third input of a row module is to be interconnected to the appertaining row address line. A column circuit contains n selection gates, whereby a respective selection gate is assigned to a column of memory cells and an output of the selection gate is connected to a gate terminal of all second of the two series-connected selection transistors for writing information in the appertaining row of memory cells and is connected to a second input of the two inputs of the data evaluation circuit assigned per column. A first input of a selection gate is interconnected to the row line, and a second input of a selection gate is interconnected to the selection gate of the appertaining column address line.

According to another feature of the invention, a memory hierarchically constructed of memory cells is particularly characterized in that each row module contains two NOR gates and an output of the first NOR gate forms a first output, an output of the second NOR gates forms a second output of a respective row module, a first input of the first NOR gate represents the first input of a row module, a first input of the second NOR gates represents the second input of a row module and a second input of the first NOR gate in common with a second input of the second NOR gate represents the third input of a row module. Each selection gate contains a NOR gate, whereby an output of a NOR gate forms the output of a selection gate and a first input and a second input of the NOR gate respectively form the first and second inputs of a selection gate. The row address lines, the column address lines, the column line for reading, the column line for writing, the row line and the data input line are connected with "active low" signals.

According to another feature of the invention, a memory hierarchically constructed of memory cells as set forth above, is particularly characterized in that the memory group has a column line, a row line for reading, a row line for writing, a data input line and a data output line assigned thereto. The row circuit contain n row modules, whereby a respective row module is assigned to a row of memory cells. An output of each row module is connected to a gate terminal of every first of the two series-connected selection transistors for writing information in the appertaining line of memory cells and is connected to a gate terminal of each selection transistor for reading information out of the appertaining row of memory cells. A first input of each row module is to be connected to the column line and a second input of each row module is to be connected to the appertaining row address line. A column circuit contains m selection gates, whereby a respective selection gate is assigned to a column of memory cells. A first output of a selection gate is connected to a gate terminal with each second of the two series-connected selection transistors for writing information into the appertaining line of memory cells and a second output of a selection gate is connected to a second input of the two inputs of the data evaluation circuit assigned per column. A first input of a selection gate is interconnected to the row line for writing, a second input of a selection gate is interconnected to the row line for reading and a third input is interconnected to the appertaining column address line.

According to another feature of the invention, a memory hierarchically constructed of memory cells is particularly characterized in that each row module contains a NOR gate and an output of the NOR gate forms the output of a row module and a first input and a second input of a NOR gate forms the first and second inputs of a row module. Each selection gate contains two NOR gates whereby one output of the first NOR gate forms the first output of the selection gate than the one output of the second NOR gate forms the second output of a selection gate. A first input of a first NOR gate represents the first input of the selection gate, a first input of the second NOR gate represents the second input of the selection gate and a second input of the first NOR gate and a second input of a second NOR gate are connected in common to the third input of a selection gate and the row address lines, the column address lines, the column line, the row line for reading, the row line for writing and the data input line are connected with "active low" signals.

According to another feature of the invention, a memory hierarchically constructed of memory cells as set forth above is particularly characterized in that a field effect transistor of a first conductivity type is a n-channel field effect transistor and a field effect transistor of a second conductivity type is a p-channel field effect transistor.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 6 is a schematic circuit diagram of an arrangement of memory cells comprising two series-connected selection transistors and two word lines within the second hierarchy level.

DESCRIPTION OF THE PREFERRED EMBODIMENTS

Figure 1:
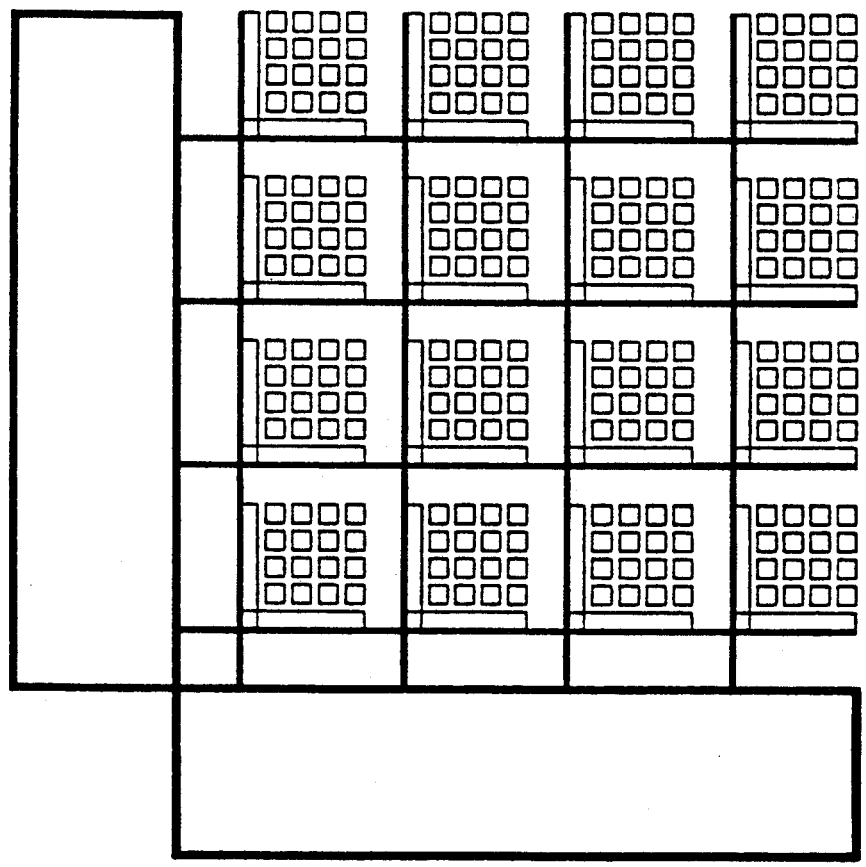
FIG. 1 is a plan view illustrating the structure of an hierarchic random access memory (RAM) of the prior art constructed in three hierarchy levels.

Referring to FIG. 1, a plan view is shown of the prior art taken from the publication by C. Mead, L. Conway, "Introduction to VLSI-Systems", Second Edition, Addison-Wesley, 1980, Chapter 8.5. The structure of an hierarchic memory (RAM) on three hierarchy levels is set forth therein. A first hierarchy level is formed of a single memory cell, whereas a memory group composed of $4 \times 4$ memory cells represents the second hierarchy level. On the third hierarchy level, finally, $4 \times 4$ memory groups are combined and are respectively driven by a row circuit and a column circuit. As may also be seen from FIG. 1, each memory group also contains an appertaining row line and column line that serves the purpose of activating the respective memory cell in the memory group. In this publication, however, a dynamic one-transistor memory cell is considered and no more detailed particulars are set forth with respect to the execution and the wiring of peripheral circuits, such as decoders and read amplifiers.

Figure 2:
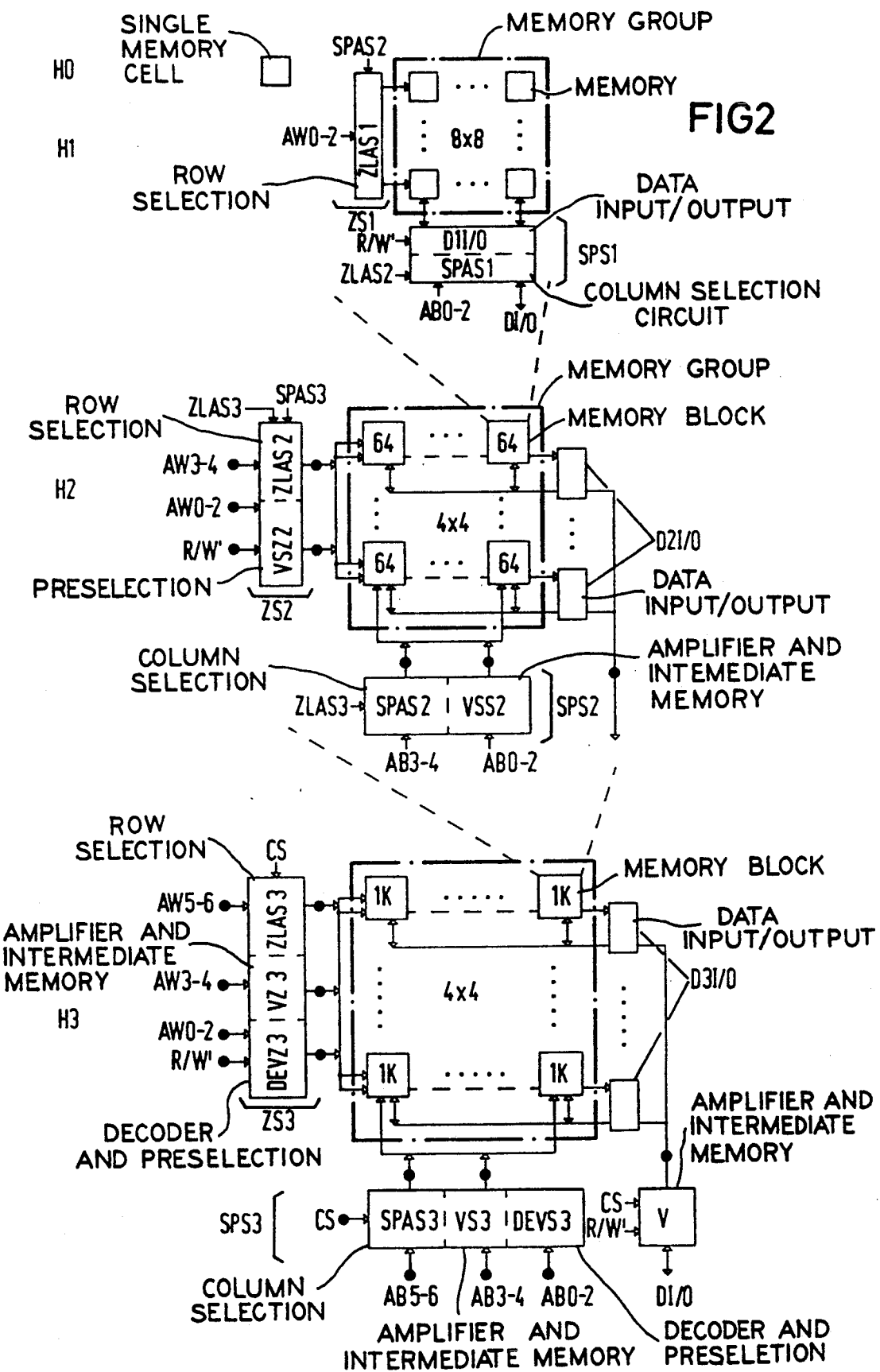
FIG. 2 is a block circuit diagram of an exemplary, static 16K memory having an hierarchical architecture.

FIG. 2 illustrates in block circuit diagram form, an exemplary static 16K memory having an hierarchial architecture. In this example, the memory is constructed in four hierarchy levels. The lowest hierarchy level H0 is formed by a single memory cell, whereas $8 \times 8$ memory cells are combined into a memory group on the hierarchy level H1. Also, $4 \times 4$ memory groups are combined in the hierarchy level H2, whereby each individual memory group contains 64 memory cells. Finally, $4 \times 4$ blocks are arranged in the hierarchy level H3, whereby each of these blocks has a storage capacity of 1K bits and is constructed corresponding to the $4 \times 4$ memory groups on hierarchy level H2. The division of the memory into four hierarchy levels was selected in order to guarantee a fast access time given good space utilization. The access time could also be further improved by utilizing smaller sub-blocks, for example memory groups having the size $4 \times 4$ memory cells on the hierarchy level H1.

A new decoding strategy must be developed for an hierarchically-organized, static memory. In order to achieve an optimally low-power consumption of the static memory and in order to shorten the delay time that arises due to a high "fanout" of the multiplexers and decoder circuits on the respective hierarchy level, it is not advantageous to activate the data inputs and the low address lines at all memory groups on an hierarchy level. Instead, it is advantageous to preselect the signals on these lines on higher hierarchy levels. This is enabled with the assistance of block select signals that are generated by the more-significant address bits. As a result thereof, the preselected address and data signals are forwarded only to the preselected sub-blocks. If, however, all signals on the data lines and low address lines were selected on each hierarchy level, this would cause an excessively-long delay time due to the required gate arrangements in the decoder path. In order to avoid this, parts of the decoding are sub-divided into blocks operating in parallel.

In accordance therewith, a data input and output circuit D1I/0 is assigned to all columns of $8 \times 8$ memory cells on the hierarchy level H1, whereas a respective data input and outputs circuit D2I/0 is present per row of 64 memory cell elements on the hierarchy level H2. On the hierarchy level H3, respectively one data input and output circuit D3I/0 is likewise assigned to a row of 1K memory blocks. The data lines of the third hierarchy level H3 are connected to an amplifier and an intermediate memory V that enables a designational data write-in and read-out for the static memory. To this end, the amplifier and intermediate memory is driven with a chip select signal CS and with a write-read signal R/W. As may be seen from FIG. 2, a respective row circuit and a respective column circuit ZS1, ZS2, ZS3 and, respectively, SPS1, SPS2, SPS3 is present in the hierarchy level H1, H2 and H3. These, however, being differently fashioned on each hierarchy level. On the hierarchy level H3, a column circuit SPS3 contains a column selection circuit SPAS3 for the most-significant address bits of the bit lines AB5 and AB6, an amplifier and intermediate memory VS3 for the address bits of the bit lines AB3–AB4 and a decoder and preselection device DEVS3 for the least-significant address bits of the bit lines AB0–AB2. Likewise, the row circuit ZS3 on this hierarchy level contains a three-fold division composed of a decoder and preselect device for the least-significant address bits of the word lines AW0–AW2 and of the applied write-read signal R/W, an amplifier and intermediate memory VZ3 for the address bits of the word lines AW3–AW4 and a row select circuit ZLAS3 for the most-significant address bits of the word lines AW5-AW6. Both the row selection circuit ZS3 and the column circuit SPS3 on this hierarchy level are respectively driven with chip select signals CS. The decoder device in the row and column circuits DEVZ3, DEVS3 on the hierarchy level H3 already decodes the least-significant address bits AB0-AB2 or, respectively, AW0-AW2 that are only required on the first hierarchy level H1. So that these least-significant address bits need not be connected to all of the 1K blocks, these are preselected with the assistance of the most-significant address bits AB5-AB6 or, respectively, AW5-AW6 and connected to only one row or, respectively, one column of 1K blocks. This is enabled by internally-generated block select signals in the row and column circuits ZS3, SPS3, On the hierarchy level H2, the column circuit SPS2 contains a preselection device VSS2 to which the decoder, least-significant address bits of the bit lines AB0-AB2 are supplied and contains a column select circuit SPAS2 to which the address bits of the bit lines AB3-AB5 are connected. The row select signal from the row select circuit ZLAS3 of the hierarchy level H3 is also required for the column circuit SPS2. The row circuit ZS2 of the hierarchy level H2 also contains a two-fold division composed of a pre-selection device VSZ2 to which the decoded, least-significant address bits of the word line AW0-AW2 and the pre-selected write-read signals R/W' are supplied and is composed of a row select circuit ZLAS2 to which the addresses of the word lines AW3-AW5 are to be connected. The row circuit ZS2 on the hierarchy level H2 is driven from the column select signal of the column select circuit SPAS3 and the row select signal of the row select circuit ZLAS3 from, respectively, the third hierarchy level H3. On the hierarchy level H2, also, the least-significant, decoded address bits AB0-AB2 or, respectively, AW0-AW2 are preselected and are connected to only one column or, respectively, row of memory groups composed of 64 memory cells. This is again achieved with the assistance of internally-formed block select signals that are generated from the addresses of the bit lines AB3-AB5 or, respectively, AW3-AW5. In the first hierarchy level H1, finally, a data input and output circuit D1I/0 and a column select circuit SPAS1 are contained in the column circuit SPS1. The data input and output circuit D1I/0 controls the bidirectional data traffic between the individual memory cells of the memory group. The decoded, least-significant address bits of the bit lines AB0-AB2 and the data input and output lines DI/0 are thereby connected to the column circuit SPS1. Thereby serving for selection are a pre-selected write-read signal R/W' for the data input/output circuit D1I/0 and a line select signal that is formed in the line select circuit ZLAS2 within the second hierarchy level H2. The row select circuit ZS1 of the memory groups in the hierarchy level H1 contains only a line select circuit ZLAS1 to which decoded, least-significant address bits of the word lines AWO-AW2 are supplied and that is controlled by a column select signal. The column select signal is thereby again taken from the column select circuit SPAS2 of the next-higher hierarchy level H2.

A realization of the first hierarchy level shall now be set forth upon utilization of new memory cells especially suited for this purpose that were disclosed in terms of a number of modifications in the patent application 88 E 1876 DE, "Static Memory Cell". Memory cells having separate write and read word lines as well as separate write and read data lines are especially well-suited for utilization in a static memory comprising a plurality of hierarchy levels. As a result of short word and data lines, memory cells of the type set forth in the aforementioned patent application can be considered here as a register in a logic circuit. Since, instead of the usual difference signals on a data line pair, only one data signal having the full CMOS level is achieved, an inverter can be employed as a read-out circuit, this saving far more space than an otherwise standard differential amplifier. The read-out circuit becomes even more compact when a logic gate is utilized instead of the inverter, one step of the data combination required in the read-out path being simultaneously co-carried out therein. Due to the separate execution of write and read word lines, it is also not necessary to operate the data input and data output signals within the first hierarchy level with the write/read control. Surface and signal running time can thereby be eliminated.

Different proposals for the execution of the circuits of the first hierarchy level arise for the various cell modifications from the above-mentioned patent application. They are set forth below for a cell block composed of 16 cells. The illustrated concept can also be employed for other cell block sizes corresponding to a different factor i, whereby i=4 was selected here, or can also be employed for arrangements having a different plurality of rows and columns. A version having more rows than columns thereby seems particularly beneficial, for example an 8×16 cell block, since the delay time on the word line is generally greater than on the data line given quadratic cell blocks.

Figure 3:
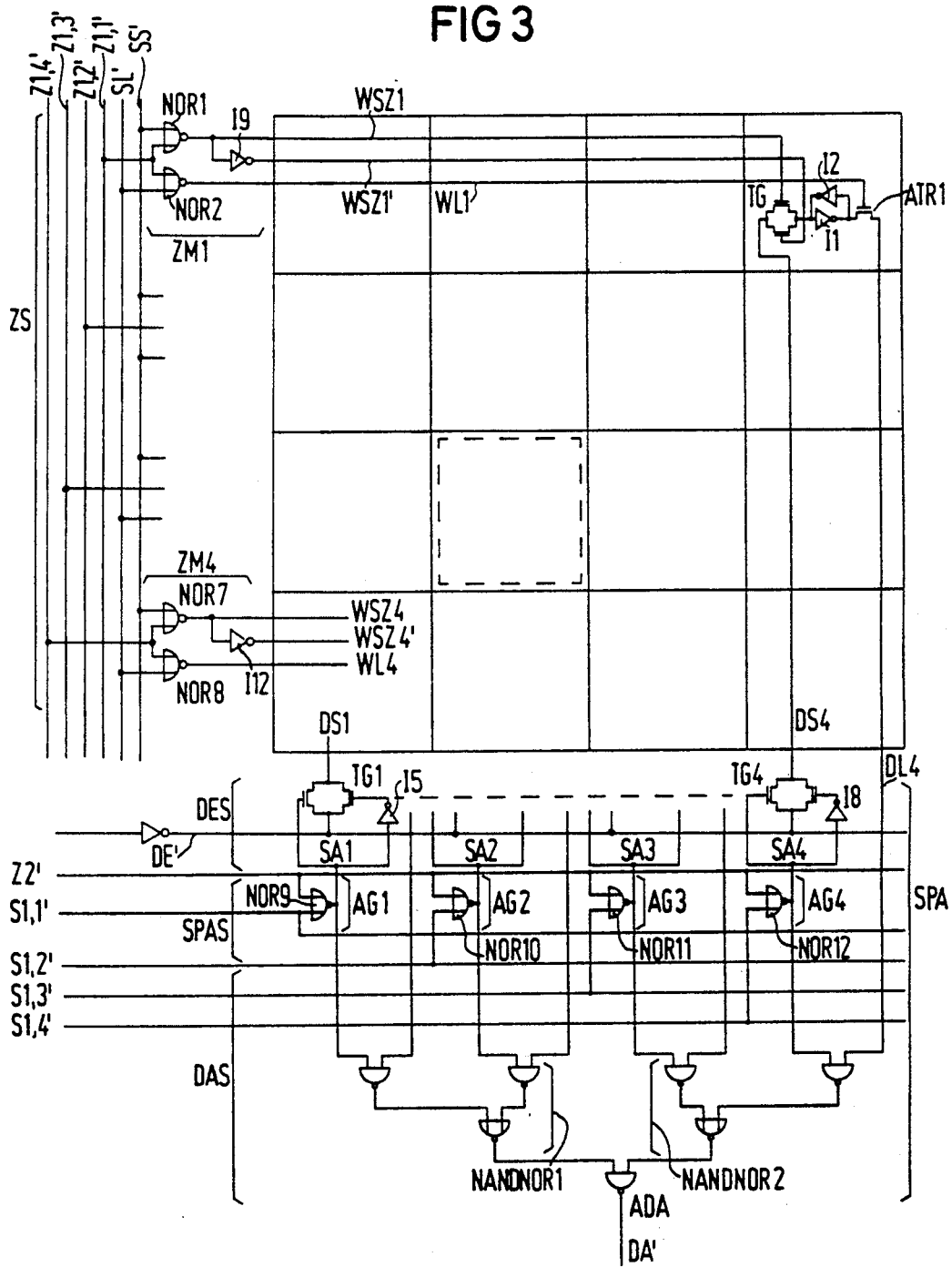
FIG. 3 is a schematic circuit diagram illustrating the arrangement of memory cells with a write word line and a read word line within a second hierarchy level.

FIG. 3 shows the arrangement of memory cells having a write data line DS1-DS4 and a read data line DL1-DL4 in a block 16 memory cells of an hierarchically-constructed, static memory with a NAND gate in the data read-out circuit. The lines for selecting a column S1, i' and a row Z1, i', i'=1, 2, 3, 4 of cell blocks are decoded on a higher hierarchy level in order to save surface space and delay time in the second hierarchy level. In the embodiment shown in FIG. 2, the 1:4 decoding of the corresponding word and bit addresses AW0, AW1 as well as AB0, AB1 occurs in the third hierarchy level H3. The predecoded signals are operated with select signals in the second hierarchy level H2 so that only the required sub-blocks are activated. Dissipated power and time are thereby saved due to a lower load on the appertaining driver circuits. The signals for the selection of a column of cell blocks for writing with the assistance of the line SS' or reading with the assistance of the line SL' as well as for the selection of a row of cell blocks by the line Z2' are generated in the second hierarchy level H2 by operation of higher-ranking signals of the row and column decoding.

Figure 4:
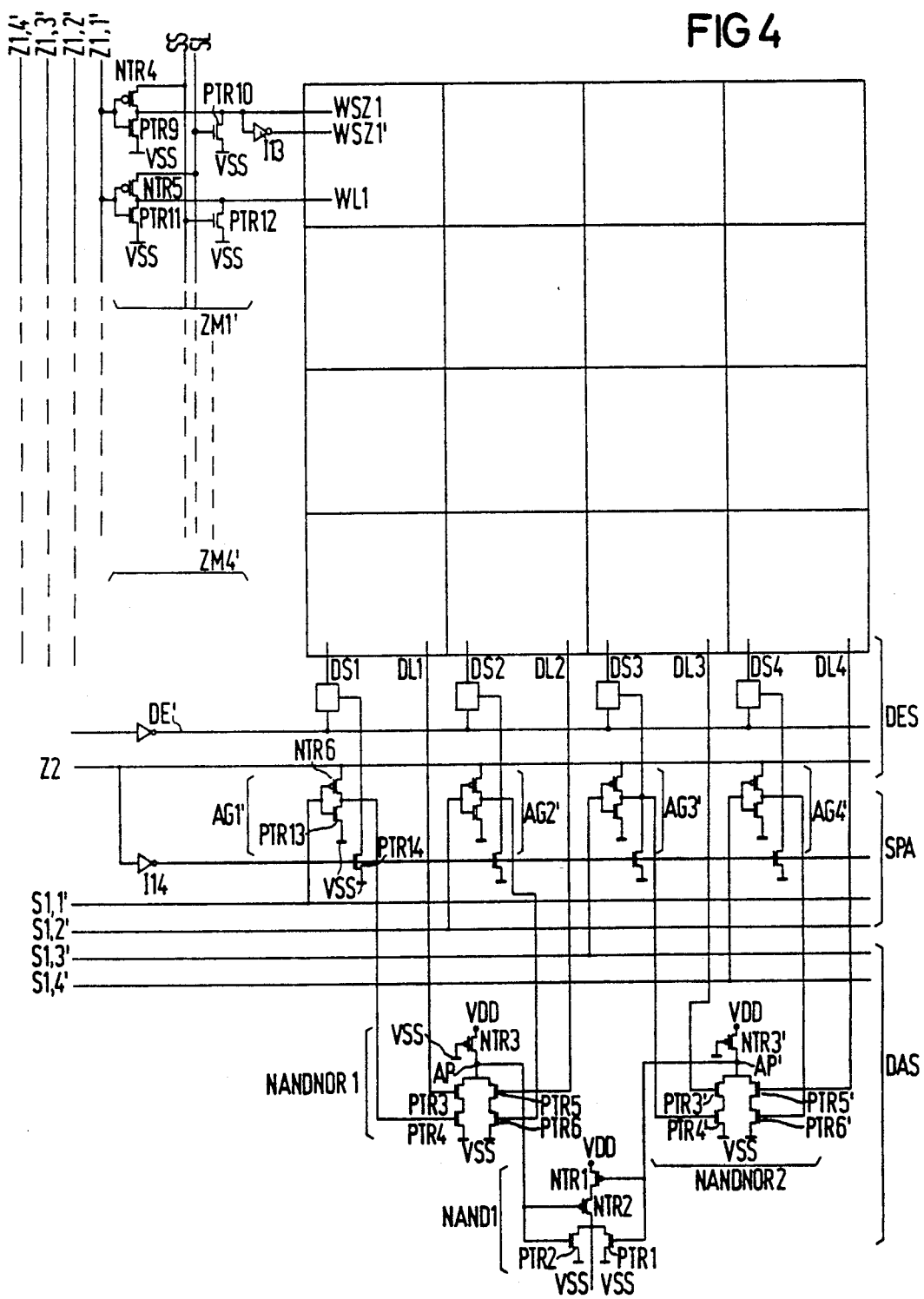
FIG. 4 is a schematic circuit diagram of an arrangement of memory cells according to FIG. 3 using compressed multi-function gates.

FIG. 3 shows a memory field composed of 4×4 memory cells. Each memory cell contains a transfer gate TG, two inverters I1, I2 and a selection transistor ATR1. The transfer gate TG of the memory cell is thereby connected between the data line belonging to the column of the memory cell for write-in of information DS4 and an input of the first inverter I1, whereby the second inverter I2 is fed back onto the first inverter I1. The selection transistor ATR1 of the respective memory cell is connected between an output of the first inverter I1 and that data line belonging to the column of the memory cell for read-out of information DL4. Reference may be taken to FIG. 4 and the appertaining description in the aforementioned patent application "Static Memory Cell" for a detailed description of this type of memory cell.

The memory cell field in FIG. 3 is divided into four columns and into four rows of memory cells. Each column can thereby have one data line for write-in of information DS1-DS4 and one data line for read-out of information DL1-DL4 allocated thereto, whereas every row requires two word lines for write-in of information WSZ1, WSZ1'-WSZ4, WSZ4' and one word line for read-out of information WL1-WL4. The data line belonging to a column for write-in (DS1-DS4) is thereby applied to each transfer gate of the memory cell that is located within the column; analogously, the data line for read-out of information (DL1-DL4) for a column is applied to each selection transistor of a memory cell that is arranged in a column. For write-in of information, each memory cell is driven with the assistance of two mutually-inverse write signals. To this end, two word lines WSZ1, WSZ1'-WSZ4, WSZ4' are present per row of memory cells, these to be respectively connected to a first and to a second control terminal of the transfer gates that belong to the memory cells in the row. For read-out of information, a third word line WL1-WL4 is additionally required per row, this to be respectively connected to the gate terminal of the selection transistor that belongs to the memory cells of the row. A transfer gate belonging to the memory cells is thereby formed of a parallel circuit of an n-channel and p-channel field effect transistor, whereby both drain terminals of, respectively, the n-channel and p-channel field effect transistors form the first terminal, both source terminals of the field effect transistors form the second terminal and the gate terminal of the p-channel field effect transistor and the gate terminal of the n-channel field effect transistor form the first or, respectively, second control input of a transfer gate.

The column circuit SPS belonging to the memory cell field of FIG. 3 contains a data input and output circuit DES, DAS as well as a column select circuit SPAS. The data input/output circuit is further subdivided into a data input circuit DES and a data output circuit DAS. The data output circuit comprises two respective inputs per column and a common output ADA, whereby a first input of these two inputs allocated per column is respectively connected to a data line for read-out of information DL1-DL4 of all memory cells of a column. The second input of the two inputs allocated per column is respectively connected to control terminals of the transfer gates in the data input circuit. A data output circuit of FIG. 3 contains a total of five AND gates and two NOR gates ANDNOR2. The two inputs allocated per column are thereby respectively connected to a AND gate and the output of the two AND gates is to be connected to a respective input of a NOR gate. The termination of the data output circuit DAS forms a last AND gate AND1 which combines the outputs of the two NOR gates. The data input circuit DES respectively contains one transfer gate TG1-TG4 allocated per column. Each of these transfer gates produces a connection between the data input line DE' and the respective data line for write-in of information DS1-DS4 into the memory cell. It contains a n-channel field effect transistor and a p-channel field effect transistor that are respectively connected parallel, so that a first terminal of the n-channel field effect transistor and a first terminal of the p-channel field effect transistor are connected to the data input line DE' and a second terminal of the n-channel field effect transistor and a second terminal of the p-channel field effect transistor are connected to the respective data line for write-in of information DS1-DS4. The drive of the transfer gate respectively occurs via a control terminal that is connected to the gate of the p-channel field effect transistor and, via an inverter I5-I8 is connected to the gate terminal of the n-channel field effect transistor.

The column selection circuit contains SPAS contains respectively one selection gate AG1-AG4 allocated per column, whereby each selection gate is constructed with the assistance of a NOR gate NOR9-NOR12. A first input of the NOR gate is to be interconnected to the appertaining column address line S1, 1'-S1, 4'; the output of the appertaining NOR gate is connected to the control terminal SA1-SA4 in the data input circuit DES that belongs to the column and is connected to the respective first input in the data output circuit DAS.

The column address line S1, 1', S1, 2', S1, 3', S1, 4', a row line Z2' and a data input DE' supplied via an inverter are respectively supplied to the column address circuits SPS.

Respectively four address lines Z1, 1', Z1, 2', Z1, 3', Z1, 4' as well as two control lines for respective writing and reading SS', SL' are assigned to the row circuits ZS. The terminals of the memory group shown in FIG. 3 for the row line Z2', the control lines for writing and reading SS', S1' correspond, in FIG. 2, to the connections SPAS2, ZLAS2, as well as to the preselected write-read signal R/W'. The row circuit in FIG. 3 contains four row modules ZM1-ZM4, whereby a respective row module is to be allocated to one row of memory cells. A first output and a second output WSZ1, WSZ1'-WSZ4, WSZ4' of each row module ZM1-ZM4 is interconnected to the first control input and second control input of all transfer transistors in the appertaining row of memory cells and supplies a control signal respectively inverse relative to one another for writing information into the appertaining memory cell. A third output WL1-WL4 of each row module ZM1-ZM4 is connected to a gate terminal of the selection transistors in the appertaining row of memory cells and therefore enables a read-out of information from the memory cell. A first input of the row module is thereby to be interconnected to the column line for reading SL', a second input is to be interconnected to the column line for writing SS', and a third input of each row module ZM1-ZM4 is to be interconnected to the appertaining row address line Z1, 1'-Z1, 4'.

Each row module ZM1-ZM4 contains two NOR gates NOR1, NOR2-NOR7, NOR8 and an inverter I9-I12, whereby a first terminal of the first NOR gate NOR1 forms the first terminal of the row module ZM1, a first terminal of the second NOR gate NOR2 forms the second terminal of a row module ZM1 and a second terminal of the first NOR gate NOR1 and a second terminal of the second NOR gate NOR2 in common form the third input of a row module ZM1. An output of the first NOR gate forms the first output WSZ1, whereby the output of the first NOR gate, via a further inverter, represents the second output WSZ1' of a respective row module ZM1. The output of the second NOR gate NOR2, finally, forms the third output WL1 of a row module ZM1. All of the terminals referenced in FIG. 3, such as S1, 1'-S1, 4', Z2', DE', Z1, 1'-Z1, 4', SS' and SL' are thereby connected with "active low" signals.

For a memory group that is constructed with the assistance of memory cells according to FIG. 2 and FIG. 3 of the aforementioned patent application "Static Memory Cell", and that contains n-channel selection transistors at the write word line, the four word lines WSZ1'-WSZ4' for writing operated with inverse signals as well as the four appertaining inverters I9-I12 are eliminated.

FIG. 4 illustrates the embodiment of FIG. 3 on the transistor level upon employment of compressed multifunction gates. In the further construction on the transistor level, it is possible to combine the gates of the decoder and read circuits to form more complex logic operations. For memory cells according to FIG. 2 and FIG. 3 of the aforementioned patent application "Static Memory Cell", having n-channel selection transistors at the write word line, the four write lines WSZ1'-WSZ4' operated with inverted signals as well as the four appertaining inverters I9-I12 are again eliminated.

The AND-NOR gates ANDNOR1, ANDNOR2, provided in pseudo-NMOS technology in the data output path are an example of the surface-beneficial realization by employing special gates. In contrast to standard pseudo-NMOS gates, the static power consumption here is not considerable in comparison to CMOS gates, since the gate in only one cell block of the overall memory is always activated or, respectively, given a memory organization having the bit width n in n cell blocks. Another possible disadvantage of pseudo-NMOS gates is that they do not supply a full CMOS output level. The anti-disturbance reliability can be diminished as a result thereof. In order to prevent this, pseudo-NMOS circuits can be utilized in the proposed employment in the data output path of the memory in alternation with pure CMOS gates that have their switching threshold set to the pseudo-NMOS level and that effect a level refresh.

FIG. 4 contains a 4×4 memory field having the same memory cells as in FIG. 3. The column circuit is likewise divided into a data input circuit DES', a data output circuit DAS', and a column selection circuit SPAS', whereas the row circuit likewise contains four row modules ZM1'-ZM4'. The interconnection of the row modules ZM1'-ZM4' in the row circuit as well as the interconnection of the column selection circuit SPAS' to the data input circuit DES' and the data output circuit DAS' is thereby undertaken in exactly the same fashion as in FIG. 3. As a difference therefrom, however, FIG. 4 shows the realization of the row modules of the column selection circuit SPAS' as well as of the data output circuits DAS' on the transistor level. The two AND-NOR gates ANDNOR1, ANDNOR2 in the input region of the data output circuit DAS' each contain four inputs and one output and a field effect transistor of a first conductivity type NTR3, NTR3' and four field effect transistors of the second conductivity type. Respectively two of the four field effect transistors of the second conductivity type PTR3, PTR4; PTR5, PTR6 or, respectively, PTR3', PTR4' PTR5', PTR6' are thereby connected in series in a AND-NOR gate ANDNOR1 and form a first series circuit and a second series circuit. The first series circuit and the second series circuit, finally, are connected in parallel between a reference potential VSS ground in this case, and a common terminal point AP, AP'. The field effect transistor of the first conductivity type NTR3, NTR3' is thereby arranged between the supply voltage VDD and the common terminal point AP, AP', whereby the common terminal point AP, AP' forms the output of the respective AND-NOR gate ANDNOR1, ANDNOR2.

A gate terminal of the field effect transistor of the first conductivity type NTR3, NTR3' is connected to the reference potential VSS (equal to ground) and the gate terminals of the field effect transistors of the first series circuit and the gate terminals of the field effect transistors of the second series circuit respectively form inputs in pairs of a NAND-NOR gate. The outputs of both AND-NOR gates ANDNOR1, ANDNOR2 are combined via a AND gate AND1, whereby the AND gate comprises two inputs and one output and contains two field effect transistors of the first conductivity type NTR1, NTR2 and two field effect transistors of the second conductivity type PTR1, PTR2. The field effect transistors of the first conductivity type NTR1, NTR2 are connected in series whereby a first terminal of the first field effect transistor of the first conductivity type NTR1 is to be connected to the supply voltage VDD and a first terminal of the second field effect transistor of the first conductivity type forms the output of the AND gate AND1. A gate terminal of the field effect transistor of the first conductivity type NTR1 and a gate terminal of the first field effect transistor of the second conductivity type PTR1 together represent the first input of the AND gate AND1 and a gate terminal of the second field effect transistor of the first conductivity type NTR2 and a gate terminal of the second field effect transistor of the second conductivity type PTR2 together represent the second input of the AND gate AND1. The first and second field effect transistors of the respective second conductivity type PTR1, PTR2 are also connected parallel between a reference potential VSS (ground in this case) and the first terminal of the second field effect transistor of the first conductivity type NTR2. According to FIG. 4, the column selection circuit SPAS' is constructed of four selection gates AG1'-AG4', whereby a respective selection gate is to be assigned to a column of memory cells. Each selection gate contains a field effect transistor of a first conductivity type and two field effect transistors of a second conductivity type. The first field effect transistor of the first conductivity type NTR6 and the first field effect transistor of the second conductivity type PTR13 are connected in series between the row line Z2 and the reference potential VSS. A gate terminal of the first field effect transistor of the first conductivity type and a gate terminal of the first field effect transistor of the second conductivity type are connected in common to the appertaining column address line S1, 1'-S1, 4' and a second terminal of the first field effect transistor of the first conductivity type and a second terminal of the first field effect transistor of the second conductivity type represent the output of the respective selection gate AG1'-AG4'. Further, the output of a respective selection gate AG1'-AG4' is connected via a second field effect transistor of the second conductivity type PTR14 to the reference potential VSS (ground in this case). A gate terminal of the second field effect transistor of the second conductivity type of each selection gate AG1'-AG4' is to be connected, according to FIG. 4, to the row line Z2 via a common inverter I14.

The row circuit contains four row modules ZM1'-ZM4', whereby each row module is again assigned to one row of memory cells. Each row module ZM1' ... is constructed with the assistance of two field effect transistors of a first conductivity type NTR4, NTR5 and four field effect transistors of a second conductivity type PTR9-PTR12 as well as of a further inverter I13. The first field effect transistor of the first conductivity type NTR5 is thereby respectively connected in series with the first field effect transistor of the second conductivity type PTR11 and the second field effect transistor of the first conductivity type NTR4 is respectively connected in series with the second field effect transistor of the second conductivity type PTR9, whereby a first terminal of the first field effect transistor of the first conductivity type in common with a gate terminal of the third field effect transistor of the second conductivity type PTR10 forms the first input of a row module ZM1', a first terminal of the second field effect transistor of the first conductivity type NTR4 in common with a gate terminal of the fourth field effect transistor of the second conductivity type PTR12 forms the second input of a row module ZM1' and a gate terminal of the first field effect transistor of the first conductivity type NTR5, a gate terminal of the first field effect transistor of the second conductivity type PTR11, a gate terminal of the second field effect transistor of the first conductivity type NTR4 and a gate terminal of the second field effect transistor of the second conductivity type PTR9 together form the third input of a row module ZM1'. The first terminal of the first field effect transistor of the second conductivity type PTR11 and a first terminal of the second field effect transistor of the second conductivity type PTR9 are connected in common to the reference potential VSS at a second terminal of the first field effect transistor of the first conductivity type NTR5 and a second terminal of the first field effect transistor of the second conductivity type PTR11 together form a third output of a row module ZM1'. The third field effect transistor of the second conductivity type PTR12 is connected between this third output and the reference potential VSS, and a second terminal of the second field effect transistor of the first conductivity type NTR4 and a second terminal of the second field effect transistor of the second conductivity type PTR9 together form the first output of a row module ZM1' and, via a further inverter I13, together form the second output of a row module ZM1'. The first output of a row module is also connected via the fourth field effect transistor of the second conductivity type PTR10 to the reference potential VSS.

The leads to the memory group are different in FIGS. 3 and 4. In FIG. 4, the column and row lines S1, 1'-S1, 4', Z1, 1'-Z1, 4' as well as the input lines DE' are connected with "active low" signals and the data line Z2, the column line for writing SS and the column line for reading SL are connected with "active high" signals.

Figure 5:
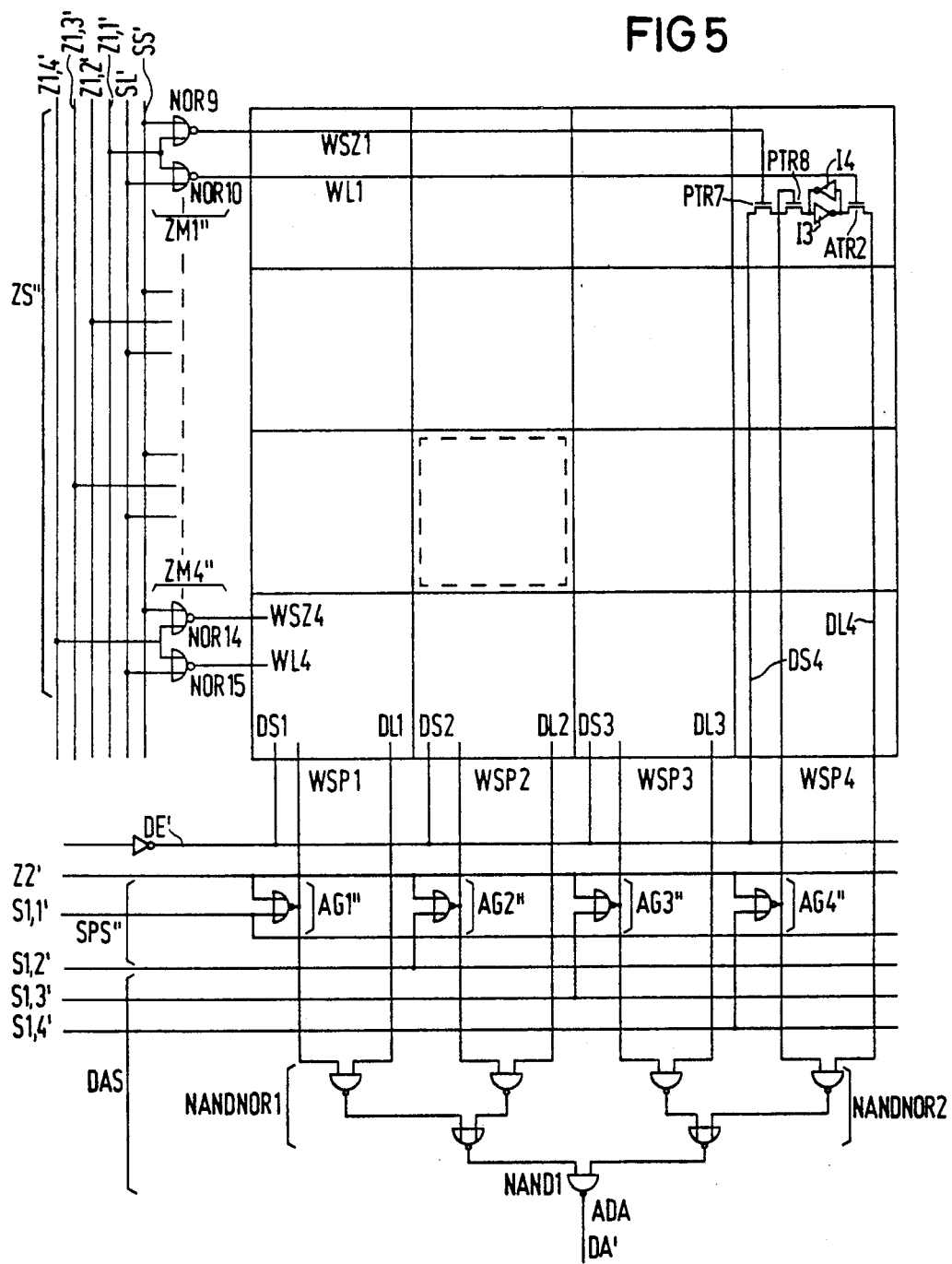
FIG. 5 is a schematic circuit diagram of an arrangement of memory cells comprising two series-connected selection transistors and three word lines within the second hierarchy level.

FIG. 5 illustrates an arrangement of memory cells comprising two series-connected selection transistors and three word lines in a block of 16 memory cells of an hierarchically constructed, static memory comprising AND gates in the data read-out circuit DAS. This type of memory cell is reproduced in detail in FIG. 5 of the aforementioned patent application bearing the title "Static Memory Cell". A comparison to the memory cells of FIG. 4 shows that the execution of an additional word column line WSP1-WSP4 in the column direction leads to considerable savings in the periphery of the row circuit ZS". In particular, four inverters for generating the inverse word write signals and four transfer gates for driving the data lines for writing information into the memory cell are eliminated. Instead of the four word write lines, four word column lines WSP1-WSP4 are required here. The execution on the transistor level corresponds to FIG. 4 given the elimination of the aforementioned gates.

According to FIG. 5, the memory cell field likewise contains 4×4 memory cells, whereby each memory cell contains two series-connected selection transistors PTR7, PTR8 for writing information into the memory cell, two inverters I3, I4 and a selection transistor ATR2 for reading information out of the memory cell. The two series-connected selection transistors PTR7, PTR8 are connected between the data line DS1-DS4 belonging to the column of the memory cell for writing information and an input of the first inverter I3. The second inverter I4 is thereby fed back onto the first inverter I3 and the selection transistor ATR2 is to be connected between an output of the first inverter I3 and the selection transistor ATR2 is to be connected between an output of the first inverter I3 and that data line for reading information DL4 that belongs to the column of the memory cell. The memory cell comprising two serial write selection transistors PTR7, PTR8 is particularly reliable against production tolerances and technology modifications. Due to the utilization of the hierarchical structure with short data lines, the read circuit can also be executed as reliable as the extremely roughed CMOS logic. A static memory designed in this manner can be scaled without design modification for a plurality of technology generations within a "shrink path" and also retains its functional reliability given a reduced supply voltage.

The interconnection of the memory cells to form a memory cell field corresponds to that in FIG. 3 or, respectively, in FIG. 4. However, the write word line operated with inverse signals is eliminated herein since the memory cell does not contain a transfer gate. Instead, a word column line WSP1-WSP4 is contained per column in the memory cell field, this column word line to be interconnected with each memory cell in the column such that, first of all, it is connected to the gate terminal of the second of the two series-connected selection transistors PTR8 for writing information and, secondly, is connected to the output of that selection gate AG4" belonging to this column. The structure of the column circuit SPS" thereby contains a data output circuit DAS as well as a column selection circuit. This column selection circuit is constructed in exactly the same manner as in FIG. 3 with selection gates AG1"-AG4" and therefore contains respectively one NOR gate per column. Due to the elimination of the transfer gates, the data input line DE' is directly connected to the data line of the appertaining column for writing information DS1-DS4.

Just as in FIG. 3, the row circuit ZS" respectively contains one row module ZM"-ZM4" assigned per row, whereby the individual row modules are to be interconnected to the row address lines Z1, 1',-Z1, 4', to the column line for reading SL' and to the column line for writing SS' exactly as in FIG. 3. Each row module thereby contains two NOR gates NOR9, NOR-10-NOR14, NOR 15, whereby one output of the first NOR gate NOR9 forms the first output, and one output of the second NOR gate NOR10 forms the second output of a respective row module ZM1". A first input of the first NOR gate NOR9 forms the first input of a row module ZM1" and a first input of the second NOR gate NOR10 forms the second input of a row module ZM1". A second input of the first NOR gate NOR9 is connected in common with a second input of the second NOR gate NOR10 and forms the third input of a row module ZM1". Just as in FIG. 3, all lines of the memory group are connected with "active low" signals.

FIG. 6 illustrates an arrangement of memory cells comprising two series-connected selection transistors and two word lines. This type of memory cell has likewise been set forth in detail in FIG. 6 of the aforementioned patent application entitled "Static Memory Cell". As already reproduced in that patent application, the circuit expense is displaced from the row decoding into the column decoding. In comparison to FIG. 5, the four NOR gates NOR10-NOR15 that drive the read word line WL1-WL4 are hereby eliminated. Instead, four NOR gates for linking the column word line WSSP1-WSSP4 to the write selection are required. The individual row word line is thereby loaded with twice the plurality of selection transistor gates. In exchange, however, cell area is thereby saved. It is precisely in hierarchically-constructed static memories having small cell blocks in the first hierarchy level that the resulting overall area and the overall delay time of the modifications between FIG. 5 and FIG. 6 must be carefully compared. Compared to FIG. 5, one write-/read word line WZ1-WZ4 per row is present in the interconnection of the memory cells in the memory cell field, this being interconnected with each memory cell in the row such that it is connected to the gate terminal of the first of the two series-connected selection transistors PTR7 . . . for writing information into the memory cells and is simultaneously connected to the gate terminal of the selection transistor ATR2 for reading information out of the memory cells.

The memory group in FIG. 6 thereby has a column line S2', a row line for reading ZL', a data input line DE' and a data output line DA' assigned thereto. The structure of the column circuit SP''' is divided onto a data output circuit DAS and onto a column selection circuit that contains respectively one selection gate AG1'''-AG4''' assigned per column. The data output circuit DAS is to be constructed in exactly the same manner as in the preceding figures, whereas a selection gate AG1''' contains two NOR gates NOR16, NOR17, whereby an output of the first NOR gate NOR16 forms the first output of the selection gate AG1''' and an output of the second NOR gate NOR17 forms the second output of a selection gate AG1'''. A first input of the first NOR gate NOR16 forms the first input of a selection gate AG1''' and a first input of the second NOR gate NOR17 forms a second input of the selection gate. A second input of the first NOR gate NOR16 and a second input of the second NOR gate NOR17 are interconnected in common to the third input of a selection gate AG1'''.

The first input of a selection gate AG1''' is to be connected to the row line for writing ZS' and the second input is to be connected to the row line for reading ZL'. The third input of a selection gate AG1''' is connected to the appertaining column address line S1, 1'. Finally, the third output of a selection gate AG1''' is to be interconnected to the appertaining column word line WSSP1 and the second output thereof is to be connected to the first of the two inputs of the data output circuit DAS assigned per column.

The row circuit ZS''' contains four row elements ZM1'''-ZM4''', whereby respectively one row module is again assigned to a row of memory cells. An output of each row module ZM1''' is to be connected to one gate terminal of each first of the two series-connected selection transistors PTR7 . . . for writing information into the appertaining row of memory cells and is to be connected to a gate terminal of each selection transistor ATR2 . . . for reading information out of the appertaining row of memory cells. A first input of each row module ZM1''' is to be connected to the column line S2' and a second input of each row module ZM''' is to be connected to the appertaining row address line Z1, 1'. Each row module contains a NOR gate, whereby one output of the NOR gate forms the output of a row module ZM1''' and a first and a second input of the NOR gate forms the first and second inputs of a row module ZM1'''.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An integrated circuit hierarchically-constructed memory, comprising:
   a plurality of memory cells combined to form memory cell groups;
   said memory being divided into more than two hierarchy levels including at least first, second and third hierarchy levels;
   one memory cell forms an element of the first hierarchy level;
   a plurality of memory cells in a memory cell group forming an element of said second hierarchy level;
   each hierarchy level higher than said second hierarchy level constructed of elements of the next-lower hierarchy level;
   a column circuit and a row circuit assigned to the elements of a hierarchy level for selecting, reading and writing;
   a column and row circuit assigned to elements of the first hierarchy level only consisting of column and row select circuits;
   a second column and row circuit assigned to elements of the second hierarchy level consisting of column and row select circuits, amplifiers and intermediate memories;
   a third column and row circuit assigned to elements of third hierarchy level and higher hierarchy levels than the third hierarchy level at least consisting of column and row select circuits, amplifiers, intermediate memories and decoder and preselection devices;
   each of said memory cells comprises an input selection gate for receiving data to be written into the memory cell, and an output selection gate for reading data from the memory cell, said input selection gate including first and second control inputs and a data input, said output selection gate including a control input and a data output;
   said row circuits each include first, second and third outputs connected to said control inputs of said input and said output selection gates of a respective row of said memory cells and a plurality of inputs for receiving read and write control signals;
   a column line for writing is connected to a first input of each of said row circuits, a column line for reading is connected to a third input of each of said row circuits, and a plurality of row address lines has each line thereof respectively connected to a second input of a respective row circuit, said row circuits responsive to control signals on said column line for reading and writing and said row address lines to activate the respective memory cells to receive and transmit data;

a plurality of column transfer gates each includes an output connected to said data input of each of said input selection gates of the memory cells of a respective column, a control input, and a data input;

a data input line is connected to said data input of each of said column transfer gates;

a plurality of selection gates each includes an output connected to said control input of a respective column transfer gate, and first and second inputs;

a row line is connected to said first inputs of each of said selection gates;

a plurality of column address input lines has each of its lines connected to said second input of a respective selection gate; and a data evaluation circuit includes a first plurality of inputs, a second plurality of inputs and an output, each input of said first plurality of inputs connected to said output of a respective selection gate, each of said inputs of said second plurality of inputs connected to said data output of said memory cells of the respective column associated with said selection gate, and said output carrying data read from said column.

2. The integrated circuit hierarchically-constructed memory cell of claim 1, wherein:

each of said transfer gates comprises a data input, first and second control inputs and an output; and each of said transfer gates comprises a first field-effect transistor of a first conductivity type and a second field-effect transistor of a second conductivity type, each of said field-effect transistors including a gate and first and second terminals, said first terminals connected together and said second terminals connected together so that said transistors are connected in parallel, said gate of said first field-effect transistor constituting said first control input and said gate of said second field-effect transistor constituting said second control input.

3. The integrated circuit hierarchically-constructed memory of claim 2, wherein:

said first conductivity type is the n conductivity type; and said second conductivity type is the p conductivity type.

4. The integrated circuit hierarchically-constructed memory of claim 1, wherein each of said row circuits comprises:

first and second NOR gates each including first and second input terminals and an output terminal;

said first input terminal of said first NOR gate constituting said first input of said row circuit;

said second input terminals of said first and second NOR gates connected together and constituting said second input of said row circuit;

said first terminal of said second NOR gate constituting said third input of said row circuit;

said output of said first NOR gate constituting said first input of said row circuit;

an inverter including an input connected to said output of said first NOR gate, and an output constituting said second output of said row circuit; and said output of said second NOR gate constituting said third output of said row circuit.

5. The integrated circuit hierarchically-constructed memory of claim 1, wherein said data evaluation circuit comprises:

a plurality of AND-NOR gate means each including two inputs each from said first and second pluralities of inputs, and an output; and AND gate means including inputs connected to said outputs of said two AND-NOR gate means, and an output constituting said output of said data evaluation circuit.

6. The integrated circuit hierarchically-constructed memory of claim 5, wherein each of said AND gate means comprises:

first and second field-effect transistors of a first conductivity type each including a gate and first and second terminals;

third and fourth field-effect transistors of a second conductivity type each including a gate and first and second terminals;

said gates of said first and third field-effect transistors connected together to form an input for said AND gate means, and said gates of said second and fourth field-effect transistors connected together to form an input for said AND gate means;

said first terminal of said first field-effect transistor connected to a supply voltage;

said second terminal of said first field-effect transistor connected to said first terminal of said second field-effect transistor;

said second terminals of said third and fourth field-effect transistors connected to a reference potential; and said second terminal of said second field-effect transistor and said first terminals of said third and fourth field-effect transistors connected together to form said output of said AND gate means of said data evaluation circuit.

7. The integrated circuit hierarchically-constructed memory of claim 6, wherein:

said first conductivity type is the n-conductivity type; and said second conductivity type is the p-conductivity type.

8. The integrated circuit hierarchically-constructed memory of claim 5, wherein each of said AND-NOR gate means comprises:

a first field-effect transistor of a first conductivity type including a gate connected to the reference potential and first and second terminals, said first terminal connected to the supply voltage;

second, third, fourth and fifth field-effect transistors of a second conductivity type each including a gate constituting a respective input of said data evaluation circuit, and first and second terminals;

said first terminals of said second and fourth field-effect transistors connected to said second terminal of said first field-effect transistor and forming an output connected to a respective input of said AND gate means;

said second terminals of said second and fourth field-effect transistors respectively connected to said first terminals of said third and fifth field-effect transistors; and said second terminals of said third and fifth field-effect transistors connected to the supply voltage.

9. The integrated circuit hierarchically-constructed memory of claim 1, wherein each of said row circuits comprises:

a first field-effect transistor of a first conductivity type, second and third field-effect transistors of a second conductivity type, a fourth field-effect transistor of the first conductivity type, fifth and sixth field-effect transistors of the second conductivity type, and an inverter including an input and an output;

each of said field-effect transistors including a gate, and first and second terminals;

said second terminals of said second, third, fifth and sixth field-effect transistors connected to a reference potential;

said input of said inverter connected to said second terminal of said first field-effect transistor, said second terminals of said first and fourth field-effect transistors respectively connected to said first terminals of said second and third and said fifth and sixth field-effect transistors and, with said output of said inverter, forming outputs of said row circuit which are connected to said control inputs of said input and output selection gates of each of said memory cells of a respective row of said memory cells, and said first terminals of said second and fourth field effect transistors connected to said column line for writing and said column line for reading; and said gates of said third and sixth field-effect transistors respectively connected to said column line for reading and said column line for writing for receiving read and write control signals.

10. The integrated circuit hierarchically-constructed memory of claim 9, wherein:
said first conductivity type is the n-conductivity type; and
said second conductivity type is the p-conductivity type.

11. An integrated circuit hierarchically-constructed memory, comprising:
a plurality of memory cells combined to form memory cell groups;
said memory being divided into more than two hierarchy levels including at least first, second and third hierarchy levels;
one memory cell forms an element of the first hierarchy level;
a plurality of memory cells in a memory cell group forming an element of said second hierarchy level;
each hierarchy level higher than said second hierarchy level constructed of elements of the next-lower hierarchy level;
a column circuit and a row circuit assigned to the elements of a hierarchy level for selecting, reading and writing;
a column and row circuit assigned to elements of the first hierarchy level only consisting of column and row select circuits;
a second column and row circuit assigned to elements of the second hierarchy level consisting of column and row select circuits, amplifiers and intermediate memories;
a third column and row circuit assigned to elements of third hierarchy level and higher hierarchy levels than the third hierarchy level at least consisting of column and row select circuits, amplifiers, intermediate memories and decoder and preselection devices;
in said second hierarchy level, for each of said memory cells, an input selection gate means for receiving and transferring data into and through said memory cell is provided and includes a data input and first and second control inputs, and an output selection gate means is provided including a control input and a data output;

a plurality of said row circuits each include first, second and third inputs, and a first output connected to said first control input of said input selection gate means of the memory cells of a respective row, and a second output connected to said control inputs of each of said output selection gate means of each memory cell of the respective row;

a column line for writing is connected to said first input of each of said row circuits;

a column line for reading is connected to said third input of each of said row circuits;

a plurality of row address lines has each of the lines thereof connected to said second input of a respective row circuit, said row circuits responsive to control signals on said column lines for reading and writing and said row address lines to activate the respective memory cells to receive and transmit data;

a data input line is connected to said data input of each of said input selection gate means;

a plurality of selection gates each include an output connected to said second control input of said input selection gate means of each of said memory cells of a respective column, and first and second inputs;

a row line is connected to said first control input of each of said selection gates;

a plurality of column address lines has each of its lines connected to a second control input of a respective selection gate, said selection gates responsive to control signals on said row line and column address lines to cause data transfer within the respective memory cells; and evaluation means include first and second pluralities of inputs, each of said inputs of said first plurality of inputs connected to said output of a respective selection gate, each of said inputs of said second plurality of inputs connected to said data output of said output control gate means of each of said memory cells of a respective column of said memory cells, and an output, said evaluation means responsive to signals on said first and second pluralities of inputs to provide output data read from said memory cell group at said output.

12. The integrated circuit hierarchically-constructed memory of claim 11, wherein each of said row circuits comprises:
a first NOR gate including a first input as said first input of said row circuit, a second input, and an output as said first output of said row circuits; and
a second NOR gate including a first input as said third input of said row circuit, a second input connected to said second input of said first NOR gate to form said second input of said row circuit, and an output as said second output of said row circuit.

13. The integrated circuit hierarchically-constructed memory of claim 11, and further comprising:
a data evaluation circuit including
a plurality of AND-NOR gate means each including two inputs each from said first and second pluralities of inputs, and an output; and
AND gate means including inputs connected to said outputs of two of said AND-NOR gate means, and an output constituting said output of said data evaluation circuit.

14. The integrated circuit hierarchically-constructed memory of claim 13, wherein said AND gate means comprises:
   first and second field-effect transistors of a first conductivity type each including a gate and first and second terminals;
   third and fourth field-effect transistors of a second conductivity type each including a gate and first and second terminals;
   said gates of said first and third field-effect transistors connected together to form an input for said AND gate means, and said gates of said second and fourth field-effect transistors connected together to form an input for said AND gate means;
   said first terminal of said first field-effect transistor connected to a supply voltage;
   said second terminal of said first field-effect transistor connected to said first terminal of said second field-effect transistor;
   said second terminals of said third and fourth field-effect transistors connected to a reference potential; and
   said second terminal of said second field-effect transistor and said first terminals of said third and fourth field-effect transistors connected together to form said output of said AND gate means and of said data evaluation circuit.

15. The integrated circuit hierarchically-constructed memory of claim 14, wherein:
   said first conductivity type is the n conductivity type; and
   said second conductivity type is the p-conductivity type.

16. The integrated circuit hierarchically-constructed memory of claim 13, wherein each of said AND-NOR gate means comprises:
   a first field-effect transistor of a first conductivity type including a gate connected to the reference potential and first and second terminals, said first terminal connected to the supply voltage;
   a second, third, fourth and fifth field-effect transistors of a second conductivity type each including a gate constituting a respective input of said data evaluation circuit, and first and second terminals;
   said first terminals of said second and fourth field-effect transistors connected to said second terminal of said first field-effect transistor and forming an output connected to a respective input of said AND gate means;
   said second terminals of said second and fourth field-effect transistors respectively connected to said first terminals of said third and fifth field-effect transistors; and
   said second terminals of said third and fifth field-effect transistors connected to the reference potential.

17. The integrated circuit hierarchically-constructed memory of claim 16, wherein:
   said first conductivity type is the n-conductivity type; and
   said second conductivity type is the p-conductivity type.

18. The integrated circuit hierarchically-constructed memory of claim 11, wherein each of said row circuits comprises:
   a first field-effect transistor of a first conductivity type, second and third field-effect transistors of a second conductivity type, a fourth field-effect transistor of the first conductivity type, fifth and sixth field-effect transistors of the second conductivity type, and an inverter including an input and an output;
   each of said field-effect transistors including a gate, and first and second terminals;
   said second terminals of said second, third, fifth and sixth field-effect transistors connected to the reference potential;
   said input of said inverter connected to said second terminal of said first field-effect transistor and said second terminals of said first and fourth field-effect transistors respectively connected to said first terminals of said second and third and fifth and sixth field-effect transistors and, with said output of said inverter, forming outputs of said row circuit which are connected to said control inputs of said selection gates of said memory cells of a respective row of said memory cells, said first terminals of said second and fourth field-effect transistors respectively connected to said column line for writing and said column line for reading;
   said gates of said first, second, fourth and fifth field-effect transistors connected to the respective row address line; and
   said gates of said third and sixth field-effect transistors respectively connected to said column line for reading and said column line for writing.

19. The integrated circuit hierarchically-constructed memory of claim 18, wherein:
   said first conductivity type is the n-conductivity type; and
   said second conductivity type is the p-conductivity type.

* * * * *